United States Patent [19]

Shiraiwa

[11] Patent Number: 5,404,894
[45] Date of Patent: Apr. 11, 1995

[54] CONVEYOR APPARATUS

[75] Inventor: Hirotsugu Shiraiwa, Hino, Japan

[73] Assignees: Tokyo Electron Kabushiki Kaisha, Tokyo; Tokyo Electron Tohoku Kabushiki Kaisha, Iwate, both of Japan

[21] Appl. No.: 62,611

[22] Filed: May 18, 1993

[30] Foreign Application Priority Data

May 20, 1992 [JP] Japan .................................. 4-152808
May 21, 1992 [JP] Japan .................................. 4-154337

[51] Int. Cl.6 ............................................ B65G 51/02
[52] U.S. Cl. ....................................... 134/66; 414/937; 414/217; 414/941; 414/416; 414/754; 414/936; 118/719; 118/500; 432/239
[58] Field of Search ................ 414/217, 222, 225, 331, 414/754, 751, 752, 287, 277, 273, 941, 939, 937, 936, 935, 416, 403; 204/298, 25; 118/500, 719; 432/239, 241, 242, 244; 134/66

[56] References Cited

U.S. PATENT DOCUMENTS

| | | | |
|---|---|---|---|
| 4,550,242 | 10/1985 | Uehara et al. | 414/937 X |
| 4,715,764 | 12/1987 | Hutchinson . | |
| 4,715,921 | 12/1987 | Maher et al. . | |
| 4,770,590 | 9/1988 | Hugues et al. | 414/937 X |
| 4,781,511 | 11/1988 | Harada et al. | 414/217 |
| 4,785,962 | 11/1988 | Toshima . | |
| 4,825,808 | 5/1989 | Takahashi et al. . | |
| 4,923,054 | 5/1990 | Ohtani et al. | 414/941 X |
| 4,962,726 | 10/1990 | Matsushita et al. | 414/217 X |
| 4,990,047 | 2/1991 | Wagner et al. | 414/217 |
| 5,026,239 | 6/1991 | Chiba et al. | 414/217 |
| 5,096,364 | 3/1992 | Messer et al. | 414/217 X |
| 5,110,248 | 5/1992 | Asano et al. | 414/217 X |
| 5,174,067 | 12/1992 | Hasegawa et al. | 414/217 X |
| 5,217,340 | 6/1993 | Harada et al. | 414/416 X |
| 5,234,303 | 8/1993 | Koyano | 414/217 |

FOREIGN PATENT DOCUMENTS

| | | | |
|---|---|---|---|
| 122541 | 5/1990 | Japan | 414/941 |
| 276261 | 11/1990 | Japan | 414/416 |
| 26138 | 1/1992 | Japan | 414/937 |
| 106952 | 4/1992 | Japan | 414/937 |
| PCT/NL90/-00027 | 9/1990 | WIPO . | |
| 9104213 | 4/1991 | WIPO | 414/217 |

Primary Examiner—Frank E. Werner
Attorney, Agent, or Firm—Beveridge, DeGrandi, Weilacher & Young

[57] ABSTRACT

A thermal processing station is provided with a first conveyor that conveys a wafer from a first conveyor access portion and a second conveyor that conveys another wafer from a second conveyor access opening portion. The wafer conveyed from the first conveyor is conveyed along a route consisting of the second conveyor, a washing portion, the second conveyor again, the first conveyor, and a thermal processing portion. On the other hand, the wafer conveyed from the second conveyor is conveyed along a route consisting of the washing portion, the second conveyor again, the first conveyor, and the thermal processing portion. An intermediate transfer portion that is free to rotate and rise and lower is provided between the first and second conveyor. A control section does not rotate the intermediate transfer portion while the wafer is being transferred along the former route, but it does rotate the intermediate transfer portion through 180° for the latter route, to keep the orientation of wafers constant during the thermal processing. In this manner, the orientation of objects to be processed, such as semiconductor wafers, can be easily managed during thermal processing.

13 Claims, 9 Drawing Sheets

CONVEYOR APPARATUS

BACKGROUND OF THE INVENTION

The present invention relates to a conveyor device for conveying an object to be processed or conveyed, such as a semiconductor wafer, in a processing station.

During the processing of a semiconductor wafer, an object to be processed could be subjected to preprocessing before a prescribed processing is performed on it in a certain processing station, or it could be subjected to postprocessing after a prescribed processing is performed. For example, before a thermal processing such as CVD is performed on a semiconductor wafer in a thermal processing station, the wafer is washed in hydrofluoric acid in order to prevent the formation of natural oxide layers on the wafer surfaces. In order to greatly increase the degrees of freedom of the processing in a thermal processing station with a built-in washing portion that enables such washing, the station is provided with a plurality of conveyor access opening portions and a plurality of conveyor means for conveying the wafers into and out of each of the conveyor access opening portions. For example, carriers for holding each different type of wafer are set in each conveyor access portion to enable the processing of different types of wafer.

Since the crystal of each wafer is orientated, orientation flats are formed in the wafers to align this crystal orientation. Wafers are held in a carrier with their orientation flats aligned, and the orientation flats are made to match a prescribed direction within the thermal processing furnace.

However, circumstances change if the conveyor route within the thermal processing station has different conveyor access openings. For example, the wafer conveyor routes are different between a case in which a wafer is taken by a first conveyor means from one conveyor access opening, that wafer is transferred to a second conveyor means and is conveyed thereby into a washing portion, the wafer is removed after it is washed from the washing portion by the second conveyor means, and then it is returned by the first conveyor means, and a case in which a wafer is taken by the second conveyor means from another conveyor access opening, that wafer is conveyed as is into the washing portion, the wafer is removed from the washing portion after it is washed, then it is transferred to the first conveyor means and is conveyed thereby into a processing furnace.

The positional relationships of the orientations of the conveyor means and the orientation flats can also change during the transfer of wafers between two or more conveyor means. For example, if a wafer is transferred directly from one conveyor means to another conveyor means, the orientation flat of the wafer will seem to have been rotated through 180° from the individual viewpoints of the two conveyor means. This positional relationship of the orientation flat also varies with the number of times the wafer is transferred one conveyor means to another. Therefore, even if the orientation flats of all the wafers in the carriers have been aligned before processing, the orientations of some wafers may end up differing from the prescribed orientation within the thermal processing furnace, depending on which conveyor access opening the wafers are introduced through. In the current state of the art, an operator first sets each wafer-containing carrier in such a manner that the orientation of the wafers in the carrier corresponds to the conveyor access opening that is to be used, to ensure that wafers end up loaded within the thermal processing furnace in a prescribed orientation.

However, this preliminary setting of the wafers' orientation by the operator necessitates constant awareness of in which conveyor access opening each carrier is to be set. There is also the problem that, if the orientation of wafers within a carrier cannot be aligned with the prescribed orientation within the thermal processing furnace, the orientation of the wafers within that carrier will have to be changed later, which is troublesome to arrange.

Another problem occurs when wafers are to be conveyed accurately by a conveyor means to or from a cassette or a wafer boat that is used to load wafers into a thermal processing portion, or unload them therefrom, in which case it is necessary to ensure that the cassette or wafer boat is accurately aligned with the direction of motion of a holder arm. For example, if the orientation of a wafer boat should deviate from the direction of motion of the holder arm, the clearance of the holder arm with respect to the support posts of the wafer boat could be different on either side when the holder arm advances into the wafer boat, and the holder arm could mount onto the wafer boat and dislodge it, or the holder arm could come into contact with the support posts.

There are inevitably manufacturing errors in the dimensions of the various components of the mounting bases of the wafer boats or cassettes, and of the conveyor means, and assembly errors occur during the assembly of these components. For example, if a conveyor chamber is configured to act as a loadlock chamber, it has to be made of welded stainless steel plate of a thickness of 15 to 20 mm, to prevent distortion when it is evacuated. However, it is particularly difficult to reduce assembly errors with this sort of configuration, and there are always manufacturing errors in the components, so it can often happen that the orientation of the wafer container, such as a wafer boat, is not aligned with the direction of motion of the holder arm. Therefore, this method is conventionally limited to conveying within a restricted area, and conveying is by a multi-jointed holder arm which has a drive axis for each joint when a long stroke within a wide area is required.

Note that, when a simple holder arm that moves backward and forward in a straight line is used, it cannot be adapted to a large system with a long stroke, but, on the other hand, the use of a multi-jointed holder arm causes problems in that the construction of the conveyor means is extremely complicated and expensive.

SUMMARY OF THE INVENTION

The present invention was devised in the light of the above problems, and has as its objective the provision of a conveyor apparatus wherein the orientation of objects to be processed can -be automatically controlled to suit the path along which the objects are conveyed, and wherein the management of the objects to be processed is extremely simple.

A further objective of the present invention is the provision of a conveyor apparatus wherein, when an object to be conveyed is transferred between a first conveyor means and a second conveyor means, it can be conveyed efficiently and also its orientation can be controlled.

The present invention relates to a conveyor apparatus wherein objects to be processed, which have a specific orientation and which have been extracted by a loading portion for objects to be processed, are transferred via an intermediate transfer portion between a first conveyor means and a second conveyor means, before they are introduced into a processing portion. This conveyor apparatus is characterized in that the intermediate transfer portion is configured so as to be rotatable, and the conveyor apparatus is also provided with a control portion that uses the intermediate transfer portion to automatically control the orientations of the objects to be processed that have been transferred in the intermediate transfer portion, in accordance with the conveyor route of the objects to be processed and in such a manner that the objects to be processed are introduced into the processing portion at a predetermined orientation.

The present invention is further characterized in that, in a conveyor apparatus that transfers objects to be processed, which have a specific directionality, between a first conveyor means and a second conveyor means via an intermediate transfer portion, the intermediate transfer portion is provided with a first transfer opening through which the objects to be processed are inserted by one of the first conveyor means and the second conveyor means and a second transfer opening through which the objects to be processed are removed by the other conveyor means. In addition, the intermediate transfer portion has a configuration in which a plurality of the objects to be processed are held in a vertical stack, and the intermediate transfer portion is also provided with a rotational means that rotates the intermediate transfer portion in a reciprocal fashion to switch the positions of the first conveyor transfer opening and the second conveyor transfer opening, and an elevator means that raises and lowers the intermediate transfer portion relative to the first conveyor means and the second conveyor means.

In accordance with the present invention, the orientation of the objects to be processed is controlled to depend upon whether the objects to be processed have been transferred an odd or an even number of times by the intermediate transfer portion, to ensure that the orientation of the objects to be processed end up in a predetermined direction.

For example, if the objects to be processed are transferred an odd number of times, after one of the conveyor means has mounted the objects to be processed in the intermediate transfer portion, the objects to be processed are reversed and are then picked up by the other conveyor means. Conversely, if they are transferred an even number of times, the intermediate transfer portion is controlled so as not to rotate.

In accordance with the present invention, after a plurality of objects to be processed are loaded into a loading portion as a batch by one transfer means, either the intermediate transfer portion is rotated so that two transfer openings thereof are switched, or the intermediate transfer portion is not rotated (depending on the conveyor route), and then the plurality of objects to be processed are transferred in a batch to the conveyor means. If there should be any difference in speed between the first and second conveyor means, the intermediate transfer portion can also function as a buffer.

Another objective of the present invention is the provision of a conveyor apparatus that is able to accurately convey objects to be processed, using a conveyor means of a simple configuration.

Another aspect of the present invention concerns a conveyor apparatus that conveys objects to be processed between a plurality of loading portions for the objects to be processed. The apparatus uses conveyor means that is provided with a holder member that is free to move forward and backward in a straight line, and is also free to rotate, and the loading portions are arranged around the path that the holder member rotates around. This apparatus is characterized in that it is provided with a movement mechanism that moves in a direction crossing the direction in which the holder member moves forward and backward.

The present invention also relates to a conveyor apparatus that is provided with a conveyor access portion through which a loading portion for objects to be processed is introduced into and removed from a processing portion, and a conveyor means that conveys objects to be processed to and from the loading portion for objects to be processed supported in the conveyor access portion. This apparatus is characterized in that it is provided with a movement mechanism that moves the loading portion for objects to be processed away from the conveyor access portion and toward the conveyor means.

With this configuration, the holder member fetches objects to be processed that have been inserted into one loading portion for objects to be processed, then the holder member moves linearly and rotates to align itself with another loading portion for objects to be processed. During this time, if the orientation of the second loading portion for objects to be processed should deviate from the axial line of the holder member, the holder member is moved perpendicular to its direction of forward motion before it enters the second loading portion for objects to be processed, to ensure it is positioned to enable the prescribed transfer of the objects to be processed into or from the loading portion for objects to be processed. In this manner, objects to be processed can be accurately conveyed by a conveyor mechanism of a simple configuration.

If the arrangement is such that the objects to be processed are moved away from the conveyor access portion and closer to the conveyor means, in order to convey the objects to be processed into or out of the loading portion for objects to be processed, the stroke of the holder member of the conveyor means can be reduced, and thus the size of the conveyor means can also be reduced.

DETAILED DESCRIPTION OF THE PREFERRED EMBODIMENTS

First Embodiment

Figure 1:
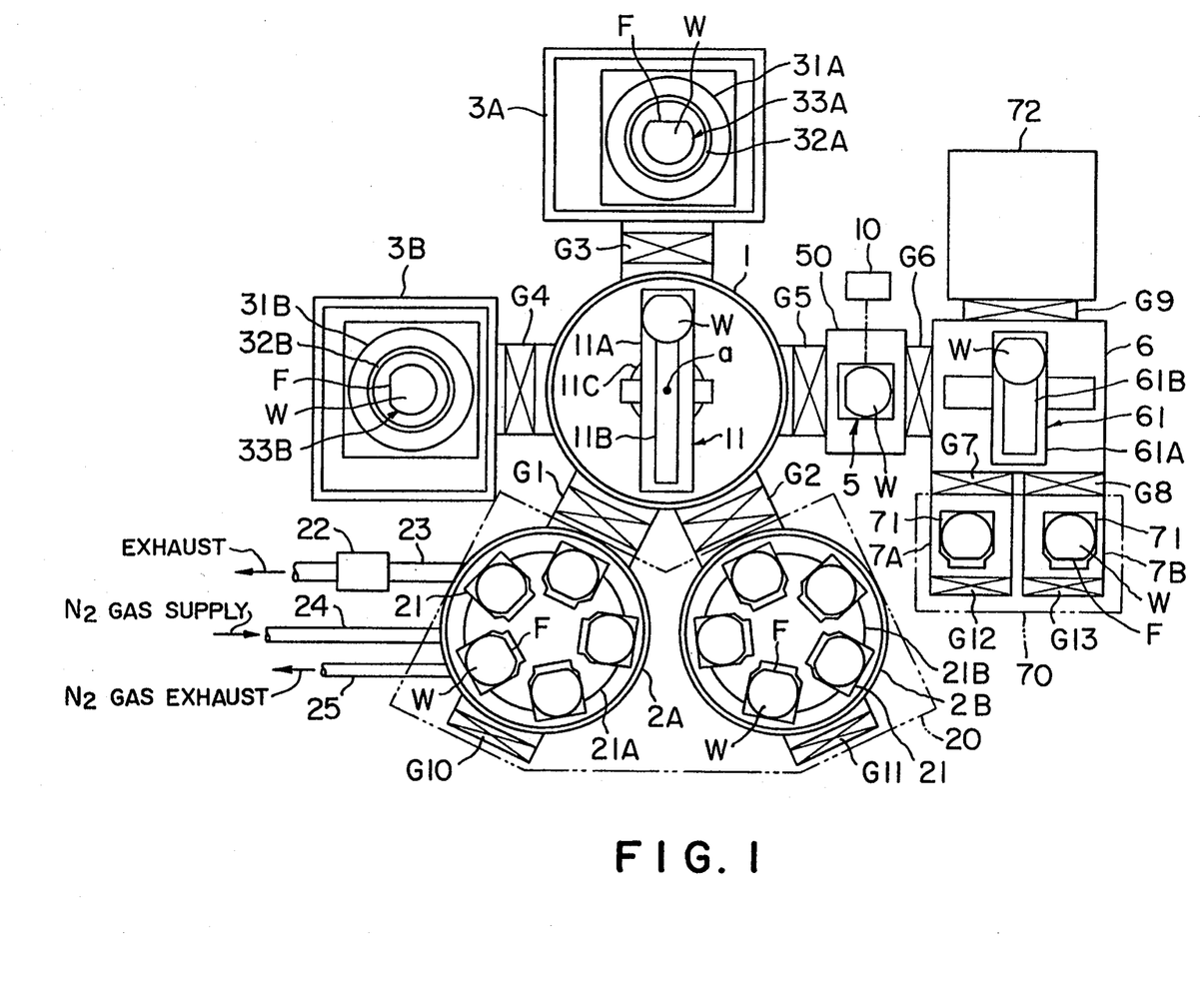
FIG. 1 is a plan view of an embodiment of the conveyor apparatus of the present invention applied to a thermal processing station for semiconductor wafers.
Figure 2:
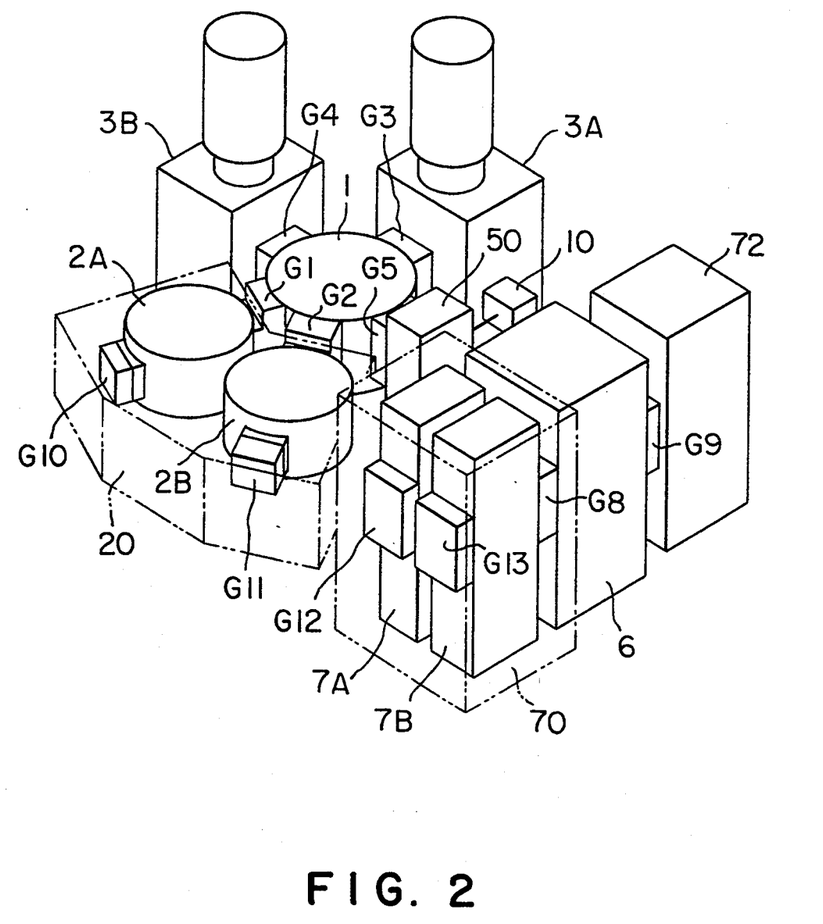
FIG. 2 is a perspective view of the thermal processing station of FIG. 1.

A plan view of a first embodiment of the conveyor apparatus of the present invention, applied to a thermal processing station for semiconductor wafers, is shown in FIG. 1 and a perspective view thereof is shown in FIG. 2. In this first embodiment of the present invention, a first conveyor means 11 that conveys a semiconductor wafer is provided in a first mounting chamber 1, and the first mounting chamber 1 is connected to two cassette chambers 2A and 2B that form a first conveyor access portion 20, via gate valves G1 and G2, respectively. The first mounting chamber 1 is also connected to thermal processing portions 3A and 3B via gate valves G3 and G4, respectively, and to an intermediate transfer chamber 50 via a gate valve G5.

The intermediate transfer chamber 50 is connected via a gate valve G6 to a second mounting chamber 6 that is provided with a second conveyor means 61. The second mounting chamber 6 is connected to two cassette chambers 7A and 7B that form a second conveyor access portion 70, via gate valves G7 and G8 respectively, and it is also connected via a gate valve G9 to a washing portion 72 for washing off and removing natural oxide layers on the surfaces of wafers W by a substance such as hydrofluoric acid.

The first conveyor means 11 provided in the first mounting chamber 1 comprises a conveyor arm 11B that is free to advance and retreat along a conveyor base 11A, and a rotational base 11C that rotates the conveyor base 11A about the center of the first mounting chamber 1. Five conveyor arms 11B could be provided stacked one above the other with spaces therebetween, as will be described below (see FIG. 3).

The cassette chambers 2A and 2B are provided with openable gate valves G10 and G11 that enable isolation from the outside (the atmosphere), and freely movable and rotatable turntables 21A and 21B that each support a number of wafer cassettes 21, such as five wafer cassettes, evenly spaced about the peripheries thereof.

The cassette chamber 2A is connected to an exhaust pipeline 23 with a vacuum pump 22 therein, a gas supply pipeline 24 of which one end is connected to a nitrogen ($N_2$) supply source, and an air pipeline 25 of which one end is connected to a factory exhaust pipeline. The interior of the cassette chamber 2A is first evacuated to a prescribed degree of vacuum by the vacuum pump 22, then a continuous fresh supply of $N_2$ gas is passed by supplying $N_2$ from the gas supply pipeline 24 while exhausting it through the air pipeline 25, thus ensuring that the concentration of $N_2$ gas in the cassette chamber 2A is maintained constant and also that any particles generated in the cassette chamber 2A are exhausted from the cassette chamber 2A to prevent these particles from attaching to the wafers.

In this manner, the cassette chamber 2A forms a loadlock chamber. The other cassette chamber 2B, the mounting chambers 1 and 6, the cassette chambers 7A and 7B, and the thermal processing portions 3A and 3B are connected to an exhaust pipeline 23, a gas supply pipeline 24, and an air pipeline 25, in the same way as the cassette chamber 2A, to form a loadlock chamber maintained continuously in an $N_2$ atmosphere. To ensure that these loadlock chambers do not deform under reduced pressures, they are made of stainless steel plate of a thickness of, for example, 15 to 20 mm.

The thermal processing portions 3A and 3B are provided with process tubes 32A and 32B surrounded by heaters 31A and 31B, and wafer boats 33A and 33B which each support a large number of wafers stacked vertically and which is moved upward and downward by an elevator base between the interior of the corresponding process tube 32 and a mounting chamber at the lower side thereof.

Figure 3:
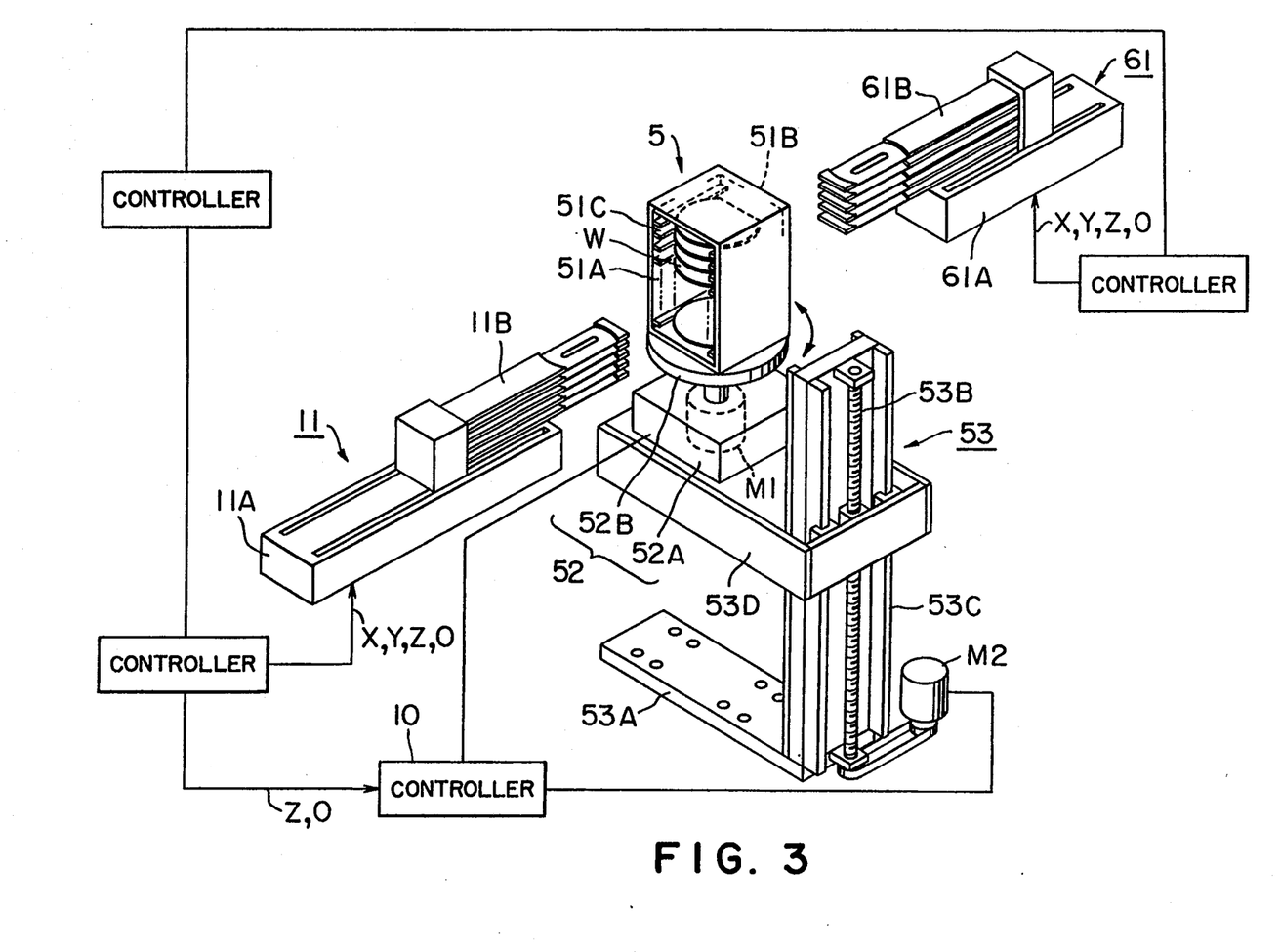
FIG. 3 is a perspective view of the essential components of a first embodiment of the conveyor apparatus of the present invention.

An intermediate transfer portion 5 is provided in the intermediate transfer chamber 50. The intermediate transfer portion 5 comprises a casing body formed of a front surface and a back surface that are open to define a first transfer opening 51A and a second transfer opening 51B, and a plurality of holder portions 51C are formed of protrusions along the two side surfaces of the casing body, for loading and holding a plurality of wafers horizontally, as shown in FIG. 3.

A rotational mechanism 52 is provided at the lower side of the intermediate transfer portion 5. The rotational mechanism 52 has a drive portion 52A comprising a motor M1 or the like, and a turntable 52B which is rotated about a vertical axis thereof by the drive portion 52A and which has the intermediate transfer portion 5 fixed to the upper surface thereof.

The drive portion 52A is connected to a control portion 10. This control portion 10 controls the drive portion 52A in accordance with the conveyor route of wafers W. In this example, if the wafers W pass once through the intermediate transfer portion 5 before they are introduced into the thermal processing portion 3A or 3B, control is such that the wafers W are rotated through 180° after they are loaded into the intermediate transfer portion 5, in other words, the positions of the first transfer opening 51A and the second transfer opening 51B are switched. If the wafers W pass twice through the intermediate transfer portion 5, the function of the control portion 10 is to control the intermediate transfer portion 5 so that it is not rotated and the wafers W remain in the same orientation.

The mode of control provided by the control portion 10 could be set by a man-machine interface such as through a keyboard to suit different routes along which the wafers W are introduced into the thermal processing portion 3A or 3B. For example, control could be enabled by automatically selecting either a control program under which the drive portion 52A is not rotated or one in which it is rotated, in accordance with preset modes. In this embodiment, since the conveyor route is determined depending on whether wafers are introduced from the first conveyor access portion 20 or the second conveyor access portion 70, as will be described below, only two modes need be provided.

The rotational mechanism 52 is combined with an elevator mechanism 53. The elevator mechanism 53 is configured of, for example, a planar base 53A fixed to the lower surface of the intermediate transfer portion 5, a guide portion 53C of H-shaped cross-section which extends vertically from the base 53A and which is also provided with a vertically arranged ball screw 53B driven by a motor M2, and an elevator base 53D which engages with the guide portion 53C and also is raised and lowered by the rotation of the ball screw 53B. The drive portion 52A is fixed to the upper surface of the elevator base 53D.

The second conveyor means 61 provided in the second mounting chamber 6 is configured in virtually the same manner as the first conveyor means 11 described above. It differs from the first conveyor means 11, however, in that a conveyor base 61A thereof, on which a conveyor arm 61B is mounted, is configured so as to be free to move in an X direction (to left and right in FIG. 1).

The cassette chambers 7A and 7B are provided with gate valves G12 and G13, respectively, that open and shut off the cassette chambers from the outside, in the same manner as the cassette chambers 2A and 2B described above, and each has mounted thereon a wafer cassette 71.

The operation of the above-described embodiment of the conveyor apparatus in accordance with the present invention will now be described.

First a number of wafers W, such as 25, which are the objects to be processed, are loaded into each of the cassettes 21 and 71 with orientation flats F thereof facing the back surface of the cassettes, and these cassettes are set within the corresponding cassette chambers 2A, 2B, 7A, and 7B. After the loadlock chambers of the cassette chambers are evacuated, N₂ gas is introduced into these chambers to provide an inert gas atmosphere therein.

Figure 4:
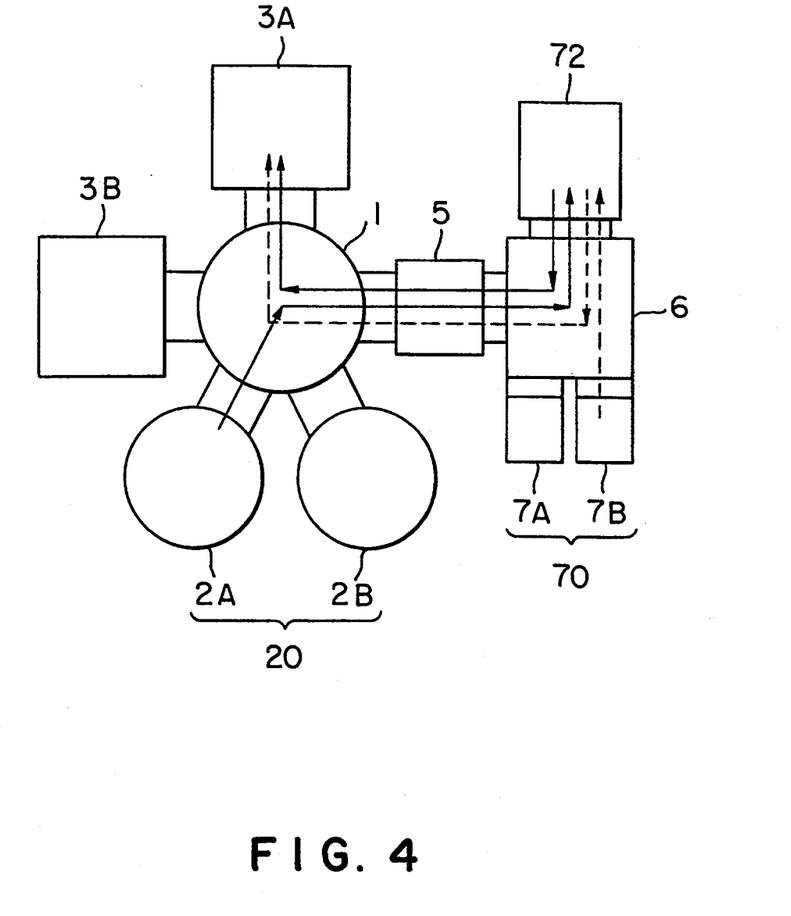
FIG. 4 is an explanatory view of the conveyor route of semiconductor wafers enabled by the conveyor apparatus of the present invention.

The contents of the first conveyor access portion 20 (in other words, the wafers W in the cassette chamber 2A or 2B), are conveyed along a route (a first mode) consisting of the first mounting chamber 1 (the first conveyor means 11), the intermediate transfer portion 5, the second mounting chamber 6 (the second conveyor means 61), the washing portion 72, the second conveyor means 61, the intermediate transfer portion 5, the first conveyor means 11, and the thermal processing portion 3A (or 3B), as shown by the solid lines in FIG. 4. The contents of the second conveyor access portion 70 (in other words, the wafers W in the cassette chamber 7A or 7B), are conveyed along a route (a second mode) consisting of the second conveyor means 61, the washing portion 72, the second conveyor means 61, the intermediate transfer portion 5, the first conveyor means 11, and the thermal processing portion 3A (or 3B), as shown by the broken lines in FIG. 4. The transfer of wafers to and from the two conveyor means 11 and 61, the intermediate transfer portion 5, and the thermal processing portions 3A and 3B can be done five wafers at a time.

In the first mode (where wafers W are conveyed in from the first conveyor access portion 20), the wafers pass twice over the intermediate transfer portion 5. If this first mode is set in the control portion 10, the wafers W are transferred in accordance with a program under which the intermediate transfer portion 5 is not rotated when the wafers W pass over it.

The operation of transferring wafers W by the intermediate transfer portion 5 in this case will be described below with reference to FIG. 3. After five conveyor arms 11B of the intermediate transfer portion 5, each with a wafer W mounted thereon, are inserted into the intermediate transfer portion 5 through the first transfer opening 51A, the intermediate transfer portion 5 is raised slightly so that the peripheral portions of the wafers W are supported on the holder portions 51C, and then the conveyor arms 11B are moved backward. The conveyor arms 61B of the second conveyor means 61 are then inserted into the intermediate transfer portion 5 through the second transfer opening 51B, the intermediate transfer portion 5 is lowered slightly so that each of the five wafers W is supported by the corresponding conveyor arm 61B, and then the conveyor arms 61B are moved backward to complete the transfer of the wafers W. After the wafers W supported on the conveyor arms 61B have been washed in the washing portion 72, the operation described above of transferring them in the first conveyor means 11 is reversed.

Figure 5A:
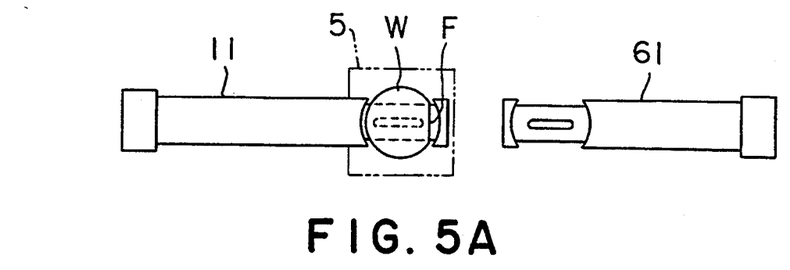
FIG. 5A to FIG. 5D are explanatory views of the orientation of semiconductor wafers on the intermediate transfer portion of the conveyor apparatus of the present invention.
Figure 5B:
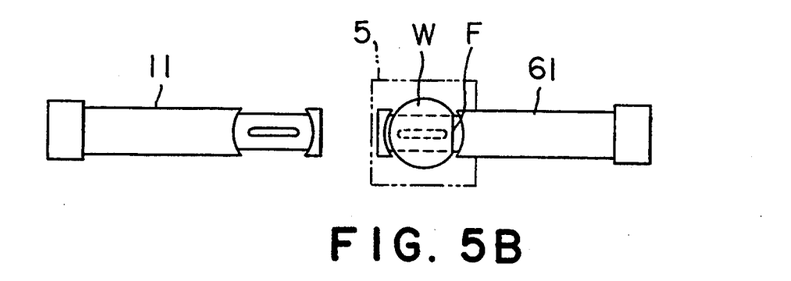

The orientation of the wafers W when they are transferred from the first conveyor means 11 to the second conveyor means 61 in the first mode is shown in FIG. 5A, and their orientation when they are transferred in the opposite direction is shown in FIG. 5B. As is clear from these diagrams, from the point of view of each of the first conveyor means 11 and the second conveyor means 61, the orientation of the wafers W (in other words the direction in which their orientation flats F is facing) when the wafers W are transferred from the first conveyor means 11 to the second conveyor means 61 is rotated through 180°. However, since the direction of the orientation flats F is again reversed when they are transferred back, the wafers W end up being conveyed into the wafer boat 33A within the thermal processing portion 3A (or 3B) in the orientation in which they were taken out of the cassette 21 by the first conveyor means 11.

Figure 5C:
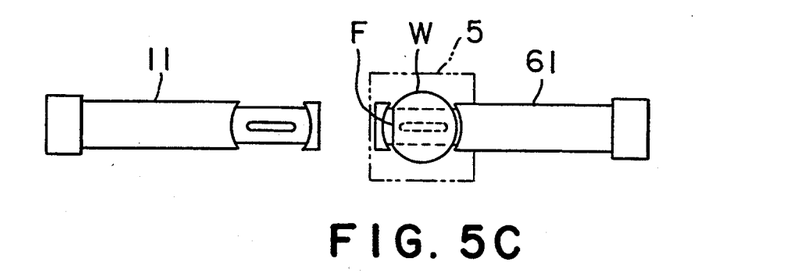
Figure 5D:
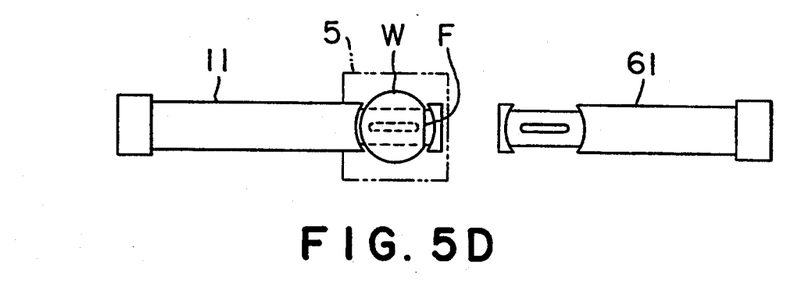

On the other hand, in the second mode (where wafers W are conveyed in from the second conveyor access portion 70), the wafers pass once over the intermediate transfer portion 5. If this second mode is set in the control portion 10, the wafers W are transferred in accordance with a program under which the intermediate transfer portion 5 is rotated through 180° when the wafers W pass over it. In other words, the first transfer opening 51A and the second transfer opening 51B are switched over. In this case, after the wafers W have been transferred onto the intermediate transfer portion 5 by the second conveyor means 61, the intermediate transfer portion 5 is rotated through 180° by the drive portion 52A, and then the wafers W are transferred to the first conveyor means 11, as shown in FIG. 5C and FIG. 5D.

Therefore, in this case, from the viewpoint of the first conveyor means 11, if the wafers W were to be fetched as they are, the direction of the orientation flats F after the second conveyor means 61 has transferred the wafers W to the intermediate transfer portion 5 would be rotated through 180°. However, before they are fetched the intermediate transfer portion 5 rotates through 180°, and thus the wafers W are introduced into the thermal processing portion 3A (or 3B) in the orientation in which they were fetched from the cassette 71 by the second conveyor means 61.

The wafer boat 33A is loaded into the process tube 32A and a thermal processing such as CVD is performed on the wafers W. After undergoing the thermal processing, the wafers W that were introduced from the first conveyor access portion 20 are returned to their original cassette 21 by the first conveyor means 11, and those that were introduced from the second conveyor access portion 70 are returned to their original cassette 71 along the route of the first conveyor means 11, the intermediate transfer portion 5, and the second conveyor means 61. With the latter route, it doesn't matter whether or not the intermediate transfer portion 5 is rotated through 180°, except that, if it is rotated, the wafers W are returned to the cassette 71 in their original orientation, so they are in the same orientation as the wafers returned to the first conveyor access portion 20 and this could be advantageous during subsequent management of the carriers.

In accordance with this first embodiment of the present invention, by setting all of the wafers W within the carriers 21 and 71 in the same orientation, the orientation in which the wafers W end up in the thermal processing portion 3A (or 3B) is the same, regardless of whether the wafers W are introduced into the thermal processing portion 3A (or 3B) from the first conveyor access portion 20 or the second conveyor access portion 70. Therefore there is no need for the operator to always be conscious of the orientation of the wafers in the carriers depending on the conveyor route, and there is no need for him to set the orientation accordingly.

Since the intermediate transfer portion 5 has a configuration such that it can hold a plurality of wafers W, not only can a plurality of wafers be simultaneously transferred as a batch between the conveyor means 11 and 61, but also more efficient conveying can be enabled because it can also act as a sort of buffer portion to absorb any discrepancy in the timing of either of the conveyor means 11 and 61. Moreover, since the intermediate transfer portion 5 can be freely raised and lowered, there is no need to change the level of the height of the conveyor means 11 and 61, and thus the conveyor access openings for the wafers between the loadlock chambers can be made smaller and therefore the gate valves can also be made smaller.

It should be obvious to those skilled in the art that, in the conveyor apparatus in accordance with the present invention, the intermediate transfer portion 5 is not limited to a structure that can hold a plurality of wafers W; for example, a plurality of pins can be provided erected on the upper surface of the turntable 52B, and a single wafer W can be mounted on those pins. Similarly, the intermediate transfer portion 5 in the conveyor apparatus in accordance with the present invention is not limited to being able to move up and down; for example, the first conveyor means 11 and the second conveyor means 61 could be raised and lowered relative to the intermediate transfer portion 5 instead. Furthermore, the present invention can be applied to an apparatus in which the object to be processed is conveyed into the processing portion from a common conveyor opening through the first conveyor means or the second conveyor means.

It should also be noted that the present invention is not limited to the conveying of wafers into a thermal processing station; it can also be applied to a processing station wherein ion implantation or ashing is performed. Similarly it can be applied to an apparatus that conveys objects in the atmosphere, or to an apparatus that conveys any object to be processed (or conveyed), not just a wafer, such as a glass substrate.

In accordance with the present invention, since the orientation of an object to be processed can be controlled by the intermediate transfer portion to face in a prescribed direction to suit the conveyor route of the object to be processed, the orientation of the object to be processed at the conveyor access portion can be kept constant regardless of the conveyor route, thus facilitating management of the object to be processed.

Second Embodiment

Figure 6:
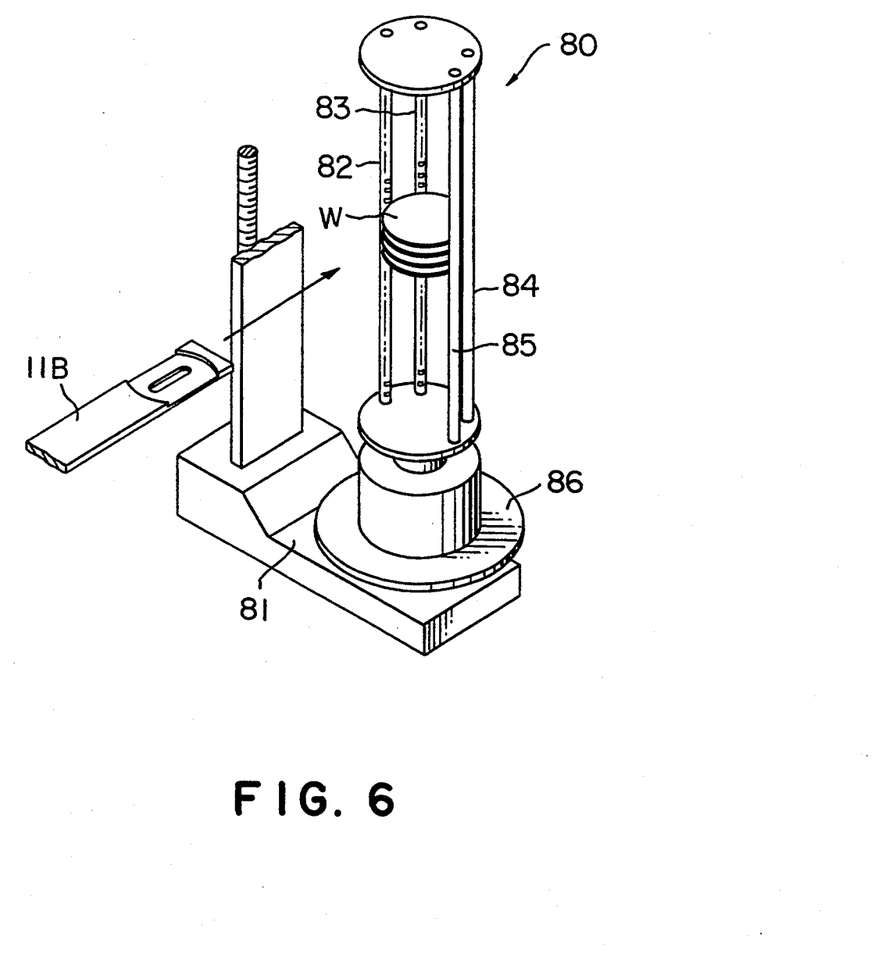
FIG. 6 is a perspective view of a second embodiment of the conveyor apparatus of the present invention, illustrating the positional relationship between a holder arm thereof and a wafer boat.

In a second embodiment of the present invention, shown in FIG. 6, each of the thermal processing portions 3A and 3B is provided with a wafer boat 80 which is moved upward and downward by an elevator base 81 between the interior of the corresponding process tube 32 (see FIG. 1) and a mounting chamber at the lower side thereof. This wafer boat 80 has a configuration such that it can hold a large number of wafers W by supporting them vertically in grooves formed in a number (such as four) of pillars 82 to 85 thereof.

Figure 7:
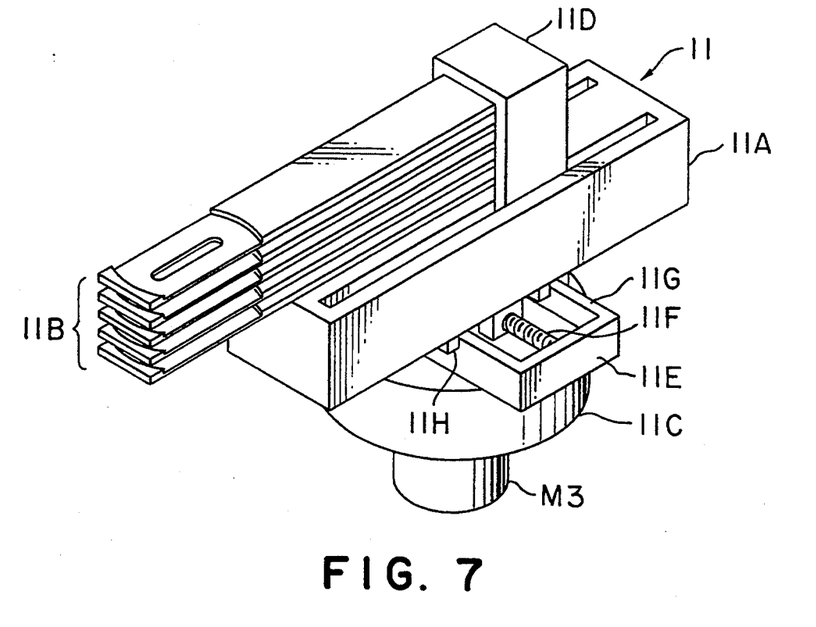
FIG. 7 is a perspective view of essential components of the second embodiment of the conveyor apparatus of the present invention.

In this case, the conveyor means 11 comprises, as shown in FIG. 7, a support portion 11D that is arranged so as to be free to move along the longitudinal direction of a conveyor base 11A; five conveyor support members such as tongue-shaped conveyor arms 11B each with a base end side thereof mounted on the support portion 11D and together holding five wafers in a vertical stack so as to convey them in a batch; a movement mechanism 11E made up of components such as a ball screw 11F engaged with the lower surface of the conveyor base 11A and a guide portion 11H which is provided on the lower surface of the conveyor base 11A and which is guided by a mounting frame 11G of the ball screw 11F in such a manner as to move the conveyor base 11A in small increments in a direction across the direction of movement of the support portion 11D, such as perpendicular thereto; and a rotational base 11C which is fixed to the mounting frame 11G and which is rotated about a vertical axis by a motor M3. This configuration enables the conveyor arms 11B to both move forward and backward along the longitudinal direction of the conveyor base 11A and move in small increments forward and backward in a direction crossing that longitudinal direction, as well as rotate.

Note that the distances from the center of rotation (a) of the rotational base 11C of the conveyor means 11 (see FIG. 1) to each turntable 21A and 21B of the cassette chambers 2A and 2B are set to be equal, and that the distances from that center of rotation to each wafer boat 80 in the region on the lower side of the mounting chamber process tubes 32 of the thermal processing portions 3A and 3B are also set to be equal.

The operation of the second embodiment of the present invention will now be described. The initial operation of washing the unprocessed wafers W loaded into the cassette chambers 2A and 2B and transferring them to the conveyor means 11 of the first mounting chamber 1 is the same as that of the first embodiment.

Next, after the conveyor means 11 has been rotated toward one of the thermal processing portions 3A, the conveyor arms 11B are moved forward and inserted into the wafer boat 80 between the pillars 82 to 85 thereof, the wafer boat 80 is raised slightly by the elevator base 81, and the wafers W mate with the grooves in the pillars 82 to 85 in such a manner that five wafers W are transferred simultaneously. The conveyor arms 11B are then moved backward and return to fetch the next group of wafers W from within the cassette chamber 2A. In this manner, a prescribed number of unprocessed wafers are loaded into the wafer boat 80.

After the prescribed number of wafers W have been loaded into the wafer boat 80, the gate valve G3 is closed, the wafer boat 80 is raised to load it into the process tube 32, and the prescribed thermal processing, such as CVD, is performed on the wafers W. Subsequently, the wafer boat 80 is lowered to unload it from the process tube 32, and, by an operation the reverse of that described above, the processed wafers W are fetched out of the wafer boat 80 by the conveyor arms 11B and are returned to their original cassette 21 in the cassette chamber 2A. In this case, depending on the mode, various different routes could be utilized. For instance, the processed wafers W could be introduced into the other thermal processing portion 3B and subjected to a different thermal processing, or wafers W fetched from the cassette chamber 2A on one side could be transferred to the cassette chamber 2B on the other side after they have been processed.

Errors in the design of the various components of the cassette guide on the turntable 21A of the cassette chamber 2A or the elevator mechanism, in addition to errors in the assembly of the various components, could result in either a cassette 21 being halted facing the mounting chamber 1 or the wafer boat 80 not mating accurately with respect to the center of rotation (a) of the conveyor means 11. In such a case, as shown for example in FIG. 8, if the opening of the wafer boat 80 (the gap between the pillars 82 and 85) has been positioned offset by an angle θ with respect to the direction of the center of rotation (a) (See FIG. 1), the conveyor base 11A of the conveyor means 11 is rotated together with the rotational base 11C in such a manner that the axial line (k) of the conveyor base 11A (the axial line of the conveyor arms 11B ends up perpendicular to the line (m) joining the pillars 82 and 85. If the ball screw 11F is also driven, the conveyor base 11A can be moved sideways until the axial line (k) is positioned passing through the center of the opening in the wafer boat 80.

After the conveyor arms 11B have been positioned in this manner, the wafers W inserted into the wafer boat 80 are transferred. If the opening of the wafer boat 80 is accurately aligned with respect to the center of rotation (a), as it is designed to be, the conveyor arms 11B are moved forward for a setting at a reference position (shown by the solid lines in FIG. 8).

Figure 8:
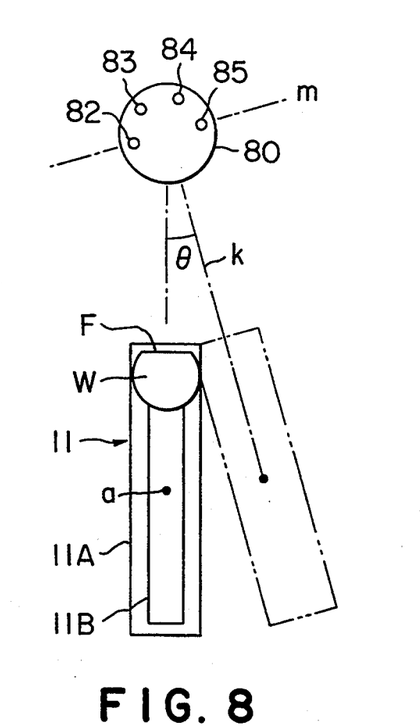
FIG. 8 is an explanatory view of the positional relationship between a holder arm of the conveyor apparatus and a wafer boat.

Therefore, regardless of whether or not the wafer boat 80 is angled in the direction it was designed for, the conveyor arms 11B always pass through the center of the opening on the wafer boat 80, so that the clearance between the pillars 82 and 83 on the left and the pillars 84 and 85 on the right is balanced, and thus the wafers W can be accurately conveyed, in other words, fetched and transferred. This contrivance need not be limited to a wafer boat 80; the same effect can be obtained when the conveyor arms 11B are conveying wafers W between the cassette in the cassette chamber 2A or 2B and the intermediate transfer portion 5 within the intermediate transfer chamber 50.

In such a case, the configuration could be such that the conveyor base 11A is fixed onto the rotational base 11C of the conveyor means 11, and the rotational base 11C is moved sideways. In addition, the conveyor arms 11B combined with the elevator mechanism need not be raised and lowered, and the number of conveyor arms 11B need not be limited to five, for example there could be just one conveyor arm 11B.

Figure 9:
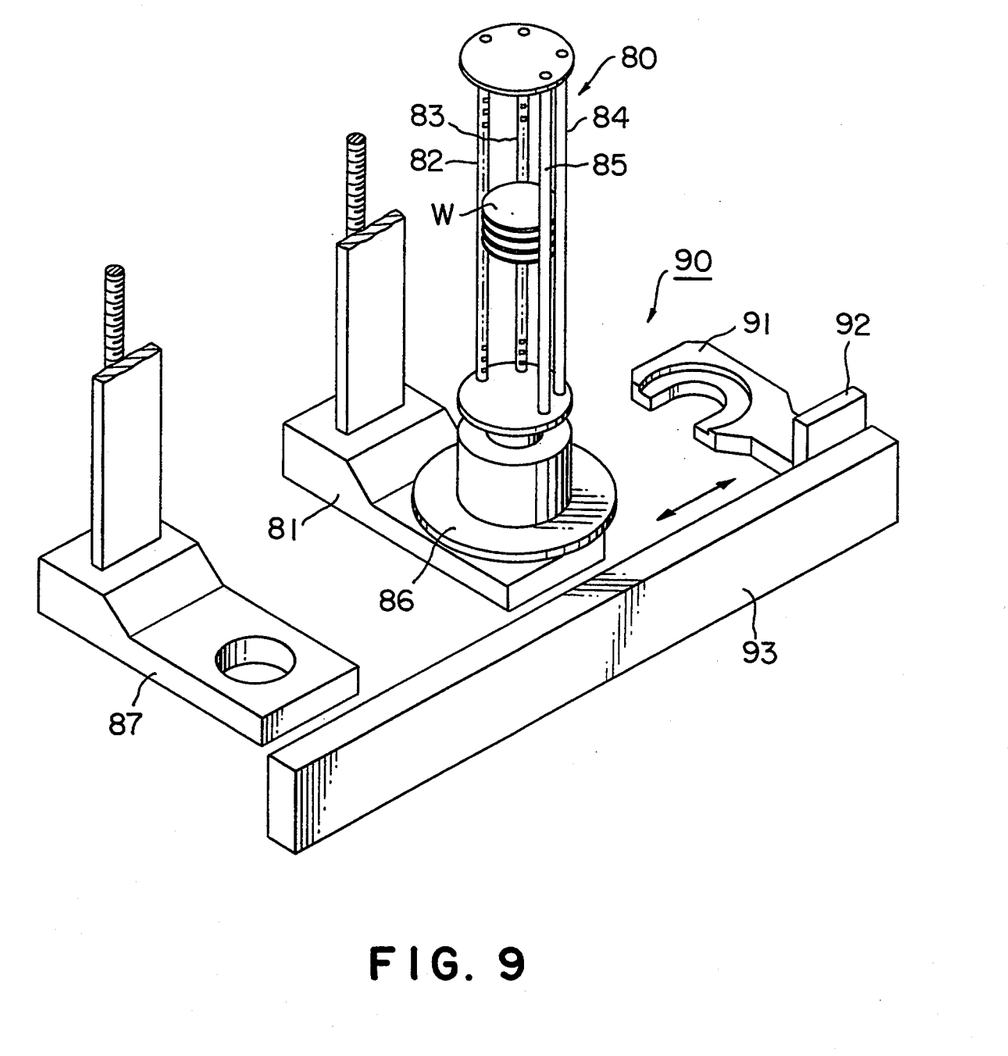
FIG. 9 is a perspective view of a third embodiment of the conveyor apparatus of the present invention.
Figure 10:
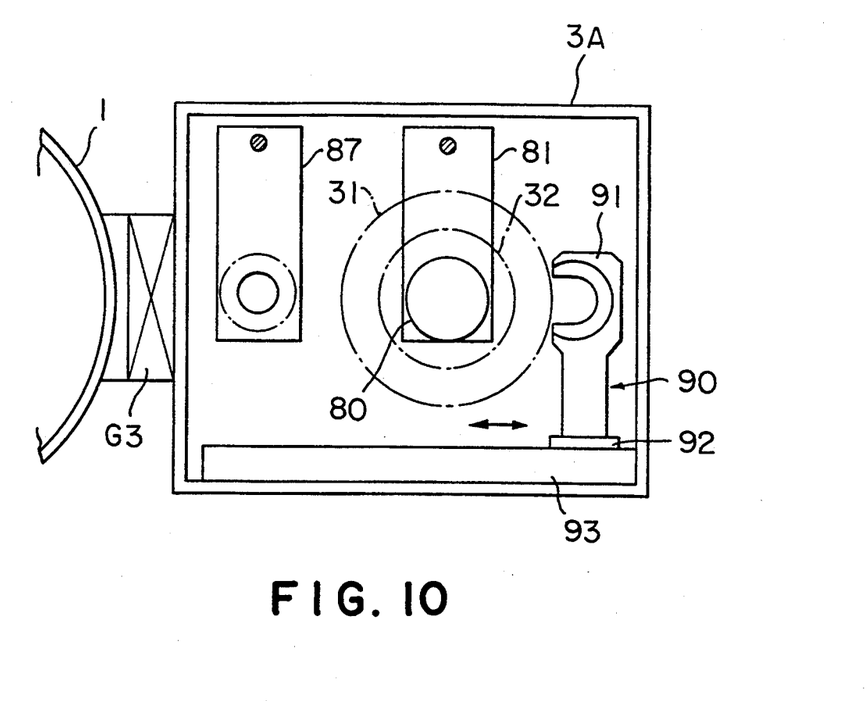
FIG. 10 is a plan view of the third embodiment shown in FIG. 9.

The thermal processing portions 3A and 3B could also be configured as shown in FIG. 9 and FIG. 10. In other words, another embodiment of the present invention shown in FIG. 9 and FIG. 10 is provided with a separate elevator base 87 that is integral with a reciprocating elevator base 81 that reciprocates at a position on the side of the mounting chamber 1 closer than the center of the process tube 32 when the wafers W are exchanged. The wafer boat 80 that forms the portion holding the objects to be processed reciprocates between the two elevator bases 81 and 87 of a thus-configured reciprocating mechanism 90.

The reciprocating mechanism 90 has a support arm 91 that mates with the lower surface of a flange portion 86 into which a cylindrical component at the lower end of the wafer boat 80 is inserted, an elevator mechanism 92 that raises and lowers the support arm 91, and a horizontal drive mechanism 93 that moves the elevator mechanism 92 in a horizontal direction (the direction of the arrows).

In the embodiment shown in FIG. 9, the wafer boat 80 unloaded from the process tube 32 is removed from the elevator base 81 by the reciprocating mechanism 90 and moved toward the elevator base 87, and the wafers W in the wafer boat 80 are fetched by the conveyor means 11 and also unprocessed wafers W are transferred into the wafer boat 80. Subsequently, the wafer boat 80 is moved back to the elevator base 81 by the reciprocating mechanism 90 and is loaded into the process tube 32.

Since the wafer boat 80 on the elevator base 81 used for loading and unloading is positioned at the center of the process tube 32, the stroke of the conveyor arms 11B of the conveyor means 11 is determined by the position of the process tube 32. However, if the wafer boat 80 is moved in a reciprocal fashion as described above, the wafer boat 80 can be placed extremely close to the conveyor means 11, and thus the stroke of the conveyor arms 11B can be made shorter. Therefore, not only the conveyor means 11 but also the mounting chamber 1 can be made smaller, which has the advantage of strengthening the mounting chamber 1 in its role as a loadlock chamber and also the amount by which the stroke is shortened has the effect of reducing the effect on the conveying of wafers W, caused by design errors in components such as the rotational mechanism of the conveyor means 11.

In this case, there is no need to provide a separate elevator base 87; the wafers W can be transferred by using the reciprocating mechanism 90 to move the conveyor means 11 while it is supporting the wafer boat 80. This apparatus that reciprocates can also be applied to a lateral type of thermal processing portion, and a conveyor means can be used that does not have a movement mechanism that moves laterally, as in the previous embodiments.

Figure 11:
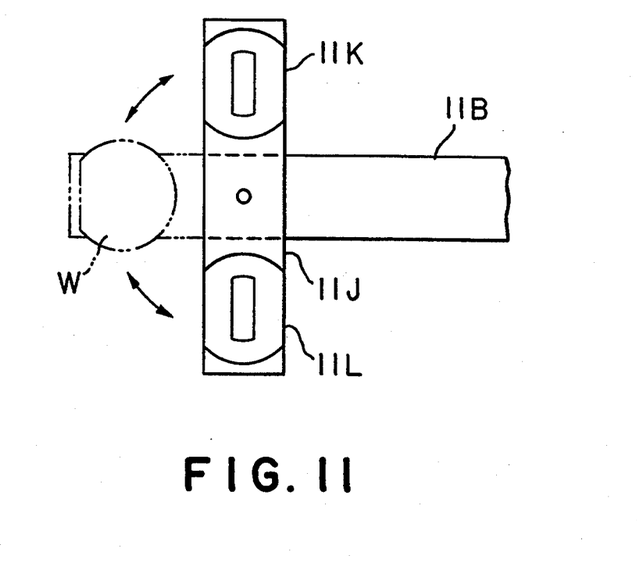
FIG. 11 is a plan view of essential components of a fourth embodiment of the conveyor apparatus of the present invention.

It should be obvious to those skilled in the art that the conveyor means 11 can use different types of conveyor arm 11B to support the wafers to be conveyed. For example, as shown in FIG. 11, a tip portion 11J of each conveyor arm 11B could be configured so as to be free to rotate and also have wafer support portions 11K and 11L formed in two end portions thereof, so that the tip portion 11J can be rotated to bring either of the wafer support portions 11K and 11L into use as required.

If this configuration is applied to a system like that of FIG. 1 wherein a silicon nitride layer is formed on a wafer surface in one thermal processing portion 3A and then a phosphorus-doped polysilicon layer is formed thereon in the other thermal processing portion 3B, and one each of the wafer support portions 11K and 11L of the conveyor arm 11B is dedicated to each of the thermal processing portions 3A and 3B, it is possible to prevent contamination due to diffusion of the phosphorus into the lower layer of the wafer. Note that dedicated use of support portions can also refer to independent movement of a plurality of dedicated support arms, and also the use of upper and lower surfaces of the support arms. The number of wafers W supported by the wafer support portions 11K and 11L can be either one or three.

What is claimed is:

1. A conveyor apparatus comprising:
   a first conveyor access structure defining a first temporary storage location for an object to be processed;
   a first mounting chamber connected to said first conveyor access structure;
   a thermal processing structure defining a thermal processing storage location for the object to be processed, said thermal processing structure being connected to said first mounting chamber;
   a second conveyor access structure defining a second temporary storage location for the object to be processed;
   a second mounting chamber connected to said second conveyor access structure;
   a first conveyor means provided in said first mounting chamber for transferring the object to be processed between said first mounting chamber and said first conveyor access structure and between said first mounting chamber and said thermal processing unit;
   a second conveyor means provided in said second mounting chamber for transferring the object to be processed;
   a freely rotatable intermediate transfer means for transferring the object to be processed, said intermediate transfer means being positioned between said first conveyor means and second conveyor means, and said second conveyor means being dimensioned and arranged for conveying the object to be processed between said intermediate transfer means and said second mounting chamber and between said second conveyor access structure and said second mounting chamber;
   a first conveyor moving means for moving said first conveyor means;
   a second conveyor moving means for moving said second conveyor means;
   an intermediate moving means for moving said intermediate transfer means; and
   a control member that controls an orientation of the intermediate transfer means so as to correspondingly control an orientation of the object to be processed which has been transferred to said intermediate transfer means, said control member controlling the orientation of said intermediate transfer means based on a route along which said object to be processed is conveyed to said thermal processing structure, the control being in such a manner that said object to be processed is loaded into said thermal processing structure in a prescribed orientation.

2. The conveyor apparatus according to claim 1, wherein said intermediate transfer portion comprises:
   a first transfer opening through which said object to be processed is transferred from said first conveyor means;
   a second transfer opening through which said object to be processed is transferred from said second conveyor means;
   a rotational means for rotating said intermediate transfer means in such a manner that said first transfer opening and said second transfer opening are at opposite rotational positions; and
   elevator means for relatively raising and lowering said intermediate transfer means with respect to said first transfer opening and said second transfer opening;
   the conveyor apparatus being further characterized in that a plurality of said objects to be processed are held in a vertical stack.

3. The conveyor apparatus according to claim 1, wherein each of said first conveyor access structure and said second conveyor access structure comprises a cassette chamber, and in that each of said first mounting chamber and said second mounting chamber comprises a loadlock chamber that is designed for evacuation and for being maintained continuously with a $N_2$ gas atmosphere after evacuation.

4. The conveyor apparatus according to claim 1, wherein said intermediate transfer means includes a batch processing support body.

5. The conveyor apparatus according to claim 1, wherein each of said first conveyor access structure, said first mounting chamber, said thermal processing structure, said second conveyor access structure, said second mounting chamber, and said intermediate transfer means is provided with a gate valve.

6. The conveyor apparatus according to claim 1, wherein said first conveyor means is configured such that the object to be processed is removed from or returned into said first conveyor access structure.

7. The conveyor apparatus according to claim 1, wherein said second conveyor means is configured such that the object to be processed is removed from or returned into said second conveyor access structure.

8. A conveyor apparatus as recited in claim 1, wherein said first conveyor access structure has a first opening at the connection between said first mounting chamber and said first conveyor access structure and a second opening at a second location on said first conveyor access structure for receiving the object to be processed externally, and said second conveyor access structure having a first opening between said second mounting chamber and said second conveyor access structure and a second opening at a second location of said second conveyor access structure for receiving the object to be processed externally; and said conveyor apparatus further comprising a second treatment processing structure in connection with said second mounting chamber, and said second conveyor means being positioned for conveying the object between said second mounting chamber and said second treatment processing structure, and said second treatment processing structure and said thermal processing structure being positioned such that the object to be processed, originating at said first conveyor access portion and to be treated in said second treatment processing structure prior to thermal treatment, passes along a first route past said intermediate transfer means twice prior to being inserted into said thermal processing structure, and such that the object to be processed, which originates at said second conveyor access structure and is to be treated in said second treatment processing structure prior to thermal treatment, passes along a second route through said intermediate transfer means once prior to entry into said thermal processing structure, and said control member including means for rotating said intermediate transfer means 180° when the object to be processed travels along said second route and 0° when the objected to be processed travels along said first route.

9. A conveyor apparatus as recited in claim 8, wherein said second treatment processing structure is a washing structure for washing the object to be processed prior to thermal treatment.

10. A conveyor apparatus as recited in claim 1 further comprising a washing structure connected to said second mounting chamber, and said conveyor apparatus being dimensioned and arranged such that the object to be processed is transferred therethrough along one of a first and a second route, and said control member including means for rotating the object when received in said intermediate transfer means, 180° when the object is traveling along said first route and 0° when the object is travelling along said second route.

11. A conveyor apparatus as recited in claim 1 wherein said intermediate transfer means includes means for supporting a semi-conductor wafer with an orientation flat.

12. A conveyor apparatus as recited in claim 1 wherein said intermediate transfer means includes means for supporting multiple objects to be transferred in a horizontal orientation and means to vertically adjust the supported objects.

13. A conveyor apparatus as recited in claim 1 wherein said control member has a first and second setting with the first being one wherein said intermediate transfer means is not rotated and the second setting being one wherein said intermediate transfer means is rotated.

* * * * *